United States Patent [19]

Darnell

[11] 3,829,598

[45] Aug. 13, 1974

[54] COPPER HEAT SINKS FOR ELECTRONIC DEVICES AND METHOD OF MAKING SAME

[75] Inventor: James R. Darnell, Dallas, Tex.

[73] Assignee: Hutson Industries, Inc., Dallas, Tex.

[22] Filed: Sept. 25, 1972

[21] Appl. No.: 292,162

[52] U.S. Cl........ 174/15 R, 174/DIG. 5, 174/52 PE, 317/100, 357/72, 357/81

[51] Int. Cl. .............................................. H01b 7/34

[58] Field of Search........ 174/DIG. 3, DIG. 5, 52 S; 317/100, 101 A, 101 CC, 234 A

[56] References Cited

UNITED STATES PATENTS

| | | | |
|---|---|---|---|
| 3,311,798 | 3/1967 | Gray | 317/234 A UX |
| 3,649,881 | 3/1972 | Chang et al. | 317/234 A X |

*Primary Examiner*—Darrell L. Clay
*Attorney, Agent, or Firm*—Richards, Harris & Medlock

[57] ABSTRACT

A copper layer is fabricated according to a method including the initial step of forming a molybdenum-manganese bonding layer. Thereafter a layer containing copper oxide or copper is formed on the bonding layer. If copper oxide is utilized, the substrate is then air dried and heated in a reducing atmosphere to transform the copper oxide layer into elemental copper. The elemental copper layer, whether formed by the reduction of copper oxide or direct application of particulate copper, is then sintered or fused to form a dense coherent structure. In one embodiment of the invention, the copper layer is utilized to bond a metal heat sink member to an electronic component mounting member. In another embodiment of the invention, the copper layer is utilized as a high conductivity lead in an electronic device.

1 Claim, 7 Drawing Figures

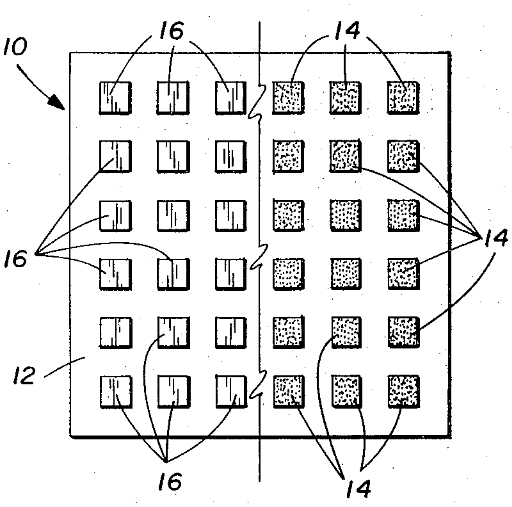
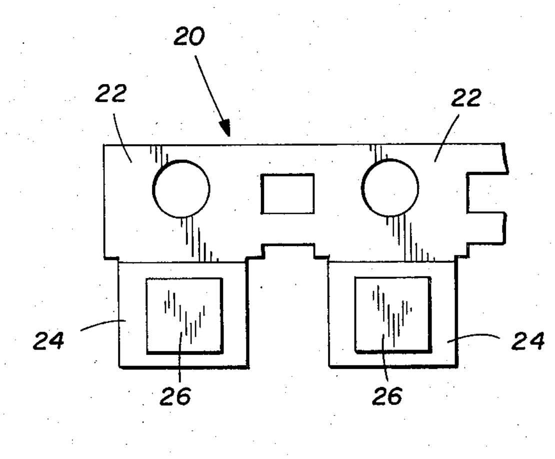
FIG. 2
FIG. 1
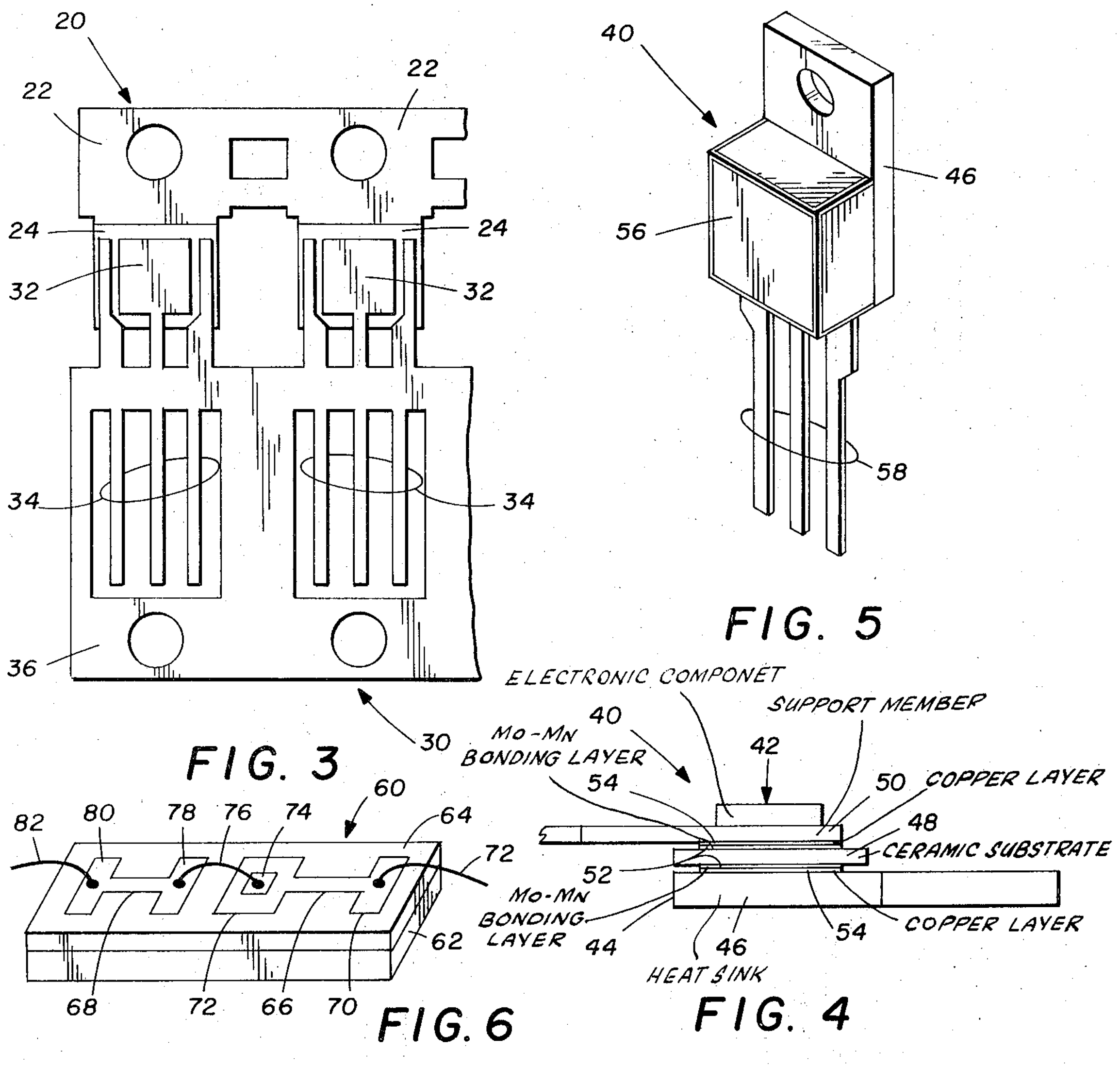
FIG. 5, FIG. 3, FIG. 6, FIG. 4

COPPER HEAT SINKS FOR ELECTRONIC DEVICES AND METHOD OF MAKING SAME

FIELD OF THE INVENTION

This invention relates generally to electronic devices utilizing copper layers, and to methods of making such devices, and more particularly relates to methods of forming copper layers for use in joining the component parts of an electrically isolated heat sink or for use as high conductivity electrical leads.

THE PRIOR ART

Electrically isolated heat sinks are widely used in the electronics industry to provide thermal protection for various electronic devices, including triacs and the like. As is well known, such electrically isolated heat sinks are typically formed primarily from metal components but include at least one ceramic component to impart electrical isolation. One difficulty encountered in manufacturing electrically isolated heat sinks involves joining the ceramic component to the remaining metal components of the device.

Heretofore it has been the practice to form nickel layers on a ceramic component in order to permit the ceramic component to be joined to the remaining components of an electrically isolated heat sink by soldering. The nickel layers are formed over the molybdenum-manganese layers on the ceramic component. The nickel layer is then utilized to form a solder joint between the ceramic component and the remaining components of the electrically isolated heat sink.

The foregoing process for joining ceramic components has gained relatively wide acceptance in the electronics industry. Nevertheless, a number of problems have been encountered in the use of the nickel plating process. For example, as compared with metals such as copper, nickel exhibits relatively poor heat transfer and electrical conductivity characteristics. Another problem involves the relative brittleness of nickel as compared with other metals. Moreover, the prior nickel process is relatively time consuming and expensive.

In addition, it is often necessary in the fabrication of electronic devices to form metal leads or conductors over a ceramic body used to support, for example, an active semiconductor chip. Such metals as nickel or the like have excessive resistance for practical use in high current applications, and thus a need exists for electrical conductors which may be easily formed in semiconductor device applications and which have sufficiently low sheet resistivities to be utilized in high current environments.

SUMMARY OF THE INVENTION

The present invention relates to metal layers for use in electrically isolated heat sinks and as electrical conductors and to a method of making such electrically isolated heat sinks and conductors whereby the foregoing disadvantages are overcome. In accordance with the broader aspects of the invention, the nickel layers which have heretofore been used to join ceramic components to the remaining components of an electrically isolated heat sink are replaced by a single copper layer. By this means the heat transfer characteristics of the heat sink are improved due to the superior heat transfer properties of copper as compared with those of nickel. Also, copper is considerably more ductile than nickel, and thus the liability of the electrically isolated heat sink to breakage is substantially reduced. Finally, manufacturing costs are reduced since it is only necessary to form one metal layer on each side of the ceramic substrate. In addition, the metal conducting layers often utilized in various semiconductor devices are replaced by a copper layer having very low sheet resistivity for use in high current applications.

More particularly, in accordance with the present invention a copper layer is formed on a ceramic component by first forming a molybdenum-manganese layer on the component. Thereafter a layer of copper particles or copper oxide dispersed in a gelled film-forming vehicle is formed on the molybdenum-manganese layer, preferably by silk screening. The copper layer is heated in a reducing atmosphere at high temperature to securely bond a layer of elemental copper to the ceramic component. The copper layer is then used in joining the ceramic component to the other components of an electrically isolated heat sink, or alternatively is used as an electrical conductor.

DESCRIPTION OF THE DRAWINGS

A more complete understanding of the invention may be had by referring to the following detailed description when taken in conjunction with the accompanying drawings, wherein:

FIG. 1 is an illustration of the initial steps in a method of making electrically isolated heat sinks incorporating the invention wherein certain components have been broken away more clearly to illustrate certain features of the invention;

FIGS. 2 and 3 are illustrations of subsequent steps in the method;

FIG. 4 is a side view illustrating a completed electrically isolated heat sink constructed in accordance with the method and an electronic component mounted on the heat sink;

FIG. 5 is a perspective view of an encapsulated electrically isolated heat sink-electronic component assembly;

FIG. 6 is a perspective view of an embodiment illustrating copper conductors formed in accordance with the present invention.

DETAILED DESCRIPTION

Figure 7:
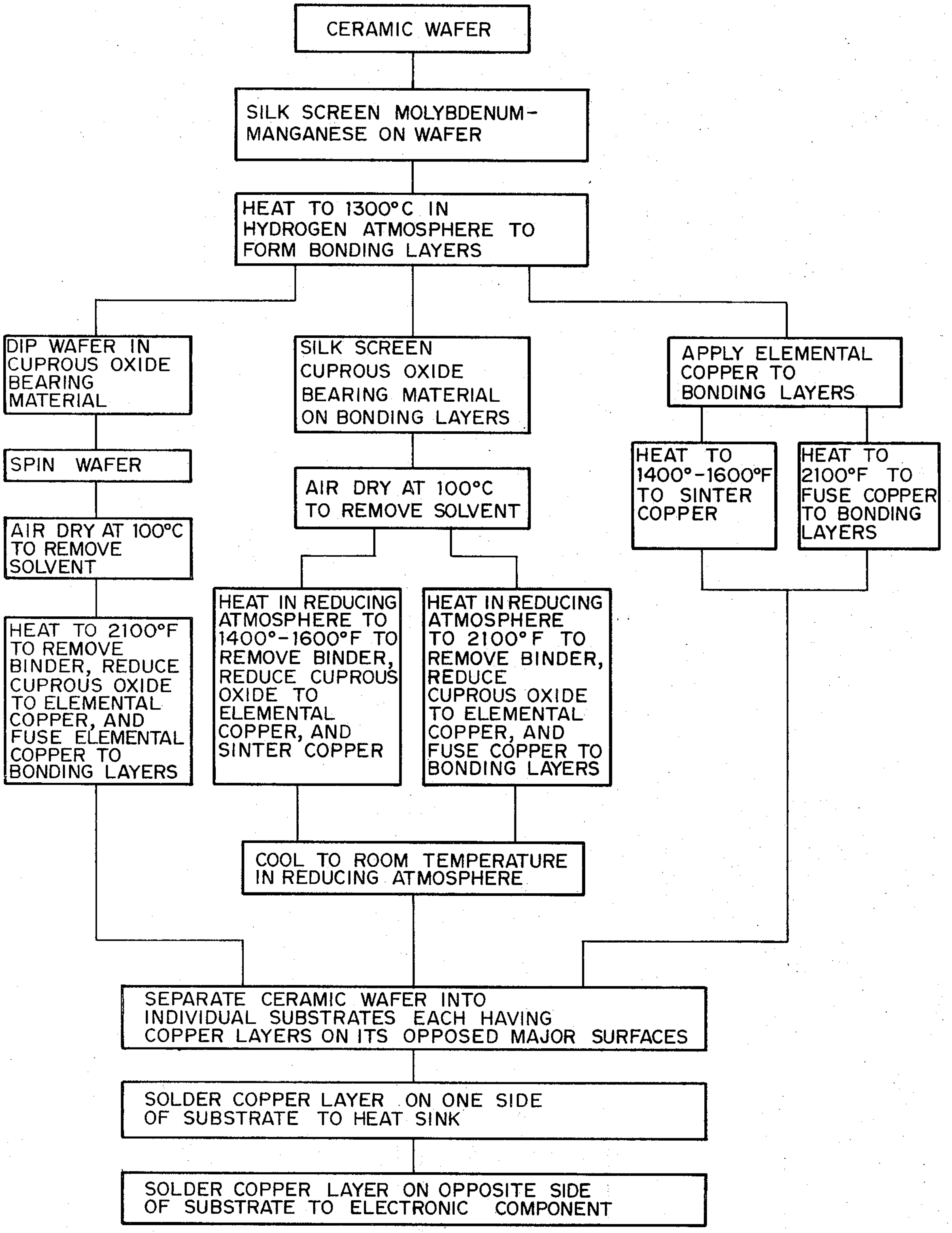
FIG. 7 is a flow chart illustrating the invention.

Referring now to the drawings, and particularly to FIGS. 1 through 4 thereof, a method of making electrically isolated heat sinks incorporating the preferred embodiment of the invention is shown. Referring particularly to FIG. 1, the first step in the method comprises the preparation of a ceramic slice or wafer 10. The ceramic wafer 10 may be formed from any of the various ceramic materials which are commonly employed in the manufacture of electronic components, for example, alumina ($Al_2O_3$) or beryllium oxide (BeO) However, the use of beryllium oxide in the fabrication of the ceramic wafer 10 is preferred due to the superior thermal conductivity characteristics of the latter material.

The shape and dimensions of the cerammic wafer 10 is not critical to the practice of the invention and may be varied in accordance with particular requirements. By way of example, the ceramic wafer 10 may comprise a thin, rectangular configuration having dimensions of approximately $2.1 \times 2.0 \times 0.020$ inches. In such a case the ceramic wafer 10 comprises opposed major surfaces 12.

The next step in the method of making electrically isolated heat sinks comprises forming layers of bonding material 14 on selected portions of the major surfaces 12 of the ceramic wafer 10. This is preferably accomplished by applying molybdenum-manganese to selected portions of each major surface 12 of the ceramic wafer 10 by means of silk screening, and then baking the ceramic wafer 10 and the molybdenum-manganese layers formed thereon at about 1,300°C in a hydrogen ($H_2$) atmosphere. Molybdenum-manganese is utilized in the preferred embodiment of the invention to form the bonding layers 14 due to its well known ability to wet and bond to ceramic materials. However, it will be understood that other materials may be utilized in the practice of the invention to form the bonding layers 14, if desired.

After the bonding layers 14 are formed on the major surfaces 12 of the ceramic wafer 10, a layer of material containing copper is applied to each bonding layer 14. For example, the material that is applied to the bonding layers 14 may contain cuprous oxide ($Cu_2O$), or alternatively elemental copper powder or the like. Suitable cuprous oxide bearing materials for this purpose are distributed by the Glidden Metals Division of SCM Corp. under the trademark "Cubond." For example, the materials identified by Glidden as "Cubond 27L" and "Cubond 56L" have been successfully utilized to practice the present invention. Both of these materials comprise cuprous oxide in a gelled film-forming vehicle.

It has been found that various techniques may be utilized to apply the cuprous oxide bearing layer to the bonding layers 14 on the ceramic wafer 10. For example, the entire ceramic wafer 10 can be dipped in a quantity of the cuprous oxide bearing material. After the dipping operation, the wafer 10 is rotated in a centrifugal spinner to provide even distribution of the cuprous oxide and to remove excess material. The wafer 10 is then air dried at about 100°C to remove the volatile solvent in the cuprous oxide bearing material. Subsequently, the wafer 10 is heated to about 2,100°F to remove the binder of the cuprous oxide material, to reduce the cuprous oxide to elemental copper and to fuse the elemental copper so it will flow to cover only the bonding layers 14.

Another method that may be utilized to apply the cuprous oxide or elemental copper material to the bonding layers 14 on the ceramic wafer 10 comprises silk screening. This method is preferable in that the cuprous oxide or elemental particulate copper bearing material is applied to the bonding layers 14 only, and is not applied to the remainder of the ceramic wafer 10. It has been found that Glidden "Cubond 27L" material may be successfully silk screened by means of a 325 mesh screen. However, it is preferable to allow the "Cubond 27L" material to air dry until a paste consistency is reached before attempting the silk screening operation. On the other hand, the Glidden "Cubond 56L" material comprises a thicker material which may be silk screened without prior air drying.

If elemental copper is applied to the bonding layers 14, the copper is heated to 2,100°F to fuse the copper, or alternatively to about 1,400°–1,600°F to sinter the copper. When the bonding layers 14 on the ceramic wafer 10 are coated with a cuprous oxide bearing layer, the cuprous oxide bearing layers are air dried at approximately 100°C to remove the volatile solvent. Thereafter the subassembly comprising the ceramic wafer 10, the bonding layers 14 formed thereon, and the cuprous oxide bearing layers formed on the bonding layers 14 is heated in a reducing atmosphere. The furnace is then turned off and the subassemblies are cooled to room temperature in the reducing atmosphere. By this heating step, the bonder vehicle is burned away from the cuprous oxide bearing layer and the cuprous oxide is reduced to elemental copper. This heating step may be carried out at 2,100°F to fuse the copper. Alternatively, this heating step may be carried out at a temperature range from about 1,400°F to 1,600°F to only sinter the copper. Sintering of the copper layers is only possible with the silk screening process because the copper pattern has been applied only over the discrete bonding layers 14. The result of the foregoing steps comprises a plurality of discrete copper layers 16 formed on the ceramic wafer 10. As will be appreciated from the foregoing, each of the copper layers 16 is positioned directly over and corresponds in shape to one of the bonding layers 14.

It has been found that copper layers when fused in accordance with the foregoing process may exhibit a patterned effect. This is believed to result from melting that occurs during the reduction of the cuprous oxide bearing layers. However, it has been determined by microscopic examination that these patterns are merely grain structure and do not comprise cracks or other damage to the copper layers.

After the copper layers 16 are formed, the ceramic wafer 10 is separated into individual substrates each having copper layers 16 formed on both of their opposed major surfaces. The separating step is preferably accomplished by conventional techniques, such as scribing and breaking. It will be understood that the copper layers 16 on the opposite sides of each substrate need not be equal in size. For example, in the preferred embodiment of the invention, the copper layer on one side of each substrate is approximately 0.250 × approximately 0.350 inch in size and is therefore adapted for connection to a heat sink member, whereas the copper layer on the opposite side of the substrate is approximately 0.160 × 0.160 inch in size and is therefore adapted for connection to an electrical component supporting member. In each instance the copper layer is preferably approximately 0.001 ± 0.0005 inch in thickness.

Referring now to FIG. 2, there is shown a strip 20 comprising a plurality of individual heat sink members 22. The heat sink members 22 are preferably formed from copper or nickel plated copper and are of substantial mass so as to provide adequate thermal protection for an electronic component. Each heat sink member 22 supports a ceramic substrate 24 having a pair of copper layers 26 formed on its opposed major surfaces in accordance with the foregoing process. Each substrate 24 is secured to its respective heat sink member 22 be means of a solder joint formed between the heat sink member and the adjacent copper layer 26.

It has been found that various soldering techniques may be employed to join copper layers formed on ceramic substrates in accordance with the present invention to other components, particularly metal components. For example, a solder comprising 60 percent tin/40 percent lead and having a liquidus temperature of about 190°C may be used.

Solder comprising 5 percent tin/95 percent lead and having a liquidus temperature of about 310°C may also be used.

Referring now to FIG. 3, there is shown a strip 30 comprising a plurality of individual electronic component supporting members 32. The strip 30 further comprises a plurality of sets of conductive terminal pins 34 and a body of scrap material 36 which serves to interconnect the pins 34 and the electronic component supporting members 32 during the assembly procedure.

In the practice of the invention, one of the foregoing soldering techniques is employed to secure the electronic component supporting members 32 of the strip 30 to the copper layers 26 on the opposite sides of the substrates 24 from the heat sink members 22 of the strip 20. Thereafter, an electronic component is mounted on each electronic component supporting member 32 and the terminals of the electronic component are joined to the pins 34 of the strip 30. The electronic component and the ceramic substrates 24 are then encapsulated in one of the various plastic or resin encapsulating materials commonly employed in the electronic component manufacturing industry. Finally, the scrap material 36 of the strip 30 is removed. The latter two steps are not critical to the practice of the invention and may be carried out in reverse order, if desired.

The foregoing procedure will be better understood by referring to FIG. 7, which comprises a flow chart illustrating the invention.

Referring now to FIG. 4, there is shown an electrically isolated heat sink-electronic component assembly 40 which has been fabricated in accordance with the foregoing process up to the encapsulating step. The assembly 40 comprises an electronic component 42, such as a triac, etc., and a heat sink 44 incorporating the present invention. The heat sink 44 comprises a heat sink member 46 adapted to provide thermal protection for the electronic component 42, a ceramic substrate 48 adapted to electrically isolate the electronic component 42 from the heat sink member 46, and a member 50 which serves to support the electronic component 42. A pair of bonding layers 52 are formed on the opposed major surfaces of the ceramic substrate 48, and a pair of copper layers 54 are in turn formed on the bonding layers 52 by means of the process comprising the present invention. The heat sink member 46 and the component support members 50 are in turn soldered to the copper layers 54 in accordance with one of the foregoing soldering techniques.

Referring now to FIG. 5, the electrically isolated heat sink-electronic component assembly 40 is shown in the completed state. A body of encapsulating material 56 extends over the electronic component 42 and over the ceramic substrate 48, the bonding layers 52 formed thereon, the copper layers 54 formed on the bonding layers 52, and the component supporting member 50 of the assembly 40. The heat sink member 46 of the assembly extends in one direction from the body of encapsulating material 56, and a plurality of terminal pins 58 extend in the opposite direction. The terminal pins 58 are of course connected to the terminals of the electronic component comprising the assembly 40.

As will be appreciated by those skilled in the art, the various steps in the foregoing method of making an electrically isolated heat sink may be tested by various techniques. For example, completed copper layers formed on ceramic substrates by means of the present invention have been etched away in order to expose the molybdenum-manganese bonding layers thereunder. The result of this procedure is illustrated in the right-hand portion of FIG. 1, wherein the bonding layers are shown exposed.

The reason for etching away the finished copper layers is to determine whether the various steps involved in forming the copper layers have any deleterious effect on the molybdenum-manganese layers. Upon completion of the etching procedure, it may be seen that the molybdenum-manganese layers are not cracked or otherwise damaged in any way. It is therefore known that the copper layers are securely bonded to the ceramic substrate and will not separate therefrom in service.

From the foregoing, it will be understood that the present invention relates to an electrically isolated heat sink and to a method of making electrically isolated heat sinks both of which comprise substantial improvements over the prior art. Thus, in accordance with the present invention, the ceramic component of such a heat sink is joined to the metal components thereof by means of copper layers formed on the ceramic component. Due to the superior thermal conductivity characteristics of copper as compared with nickel there is thus provided an electrically isolated heat sink having improved heat transfer characteristics. Also, due to the superior ductility of copper as compared with nickel, the use of the present invention results in an electrically isolated heat sink which is substantially less liable to breakage than are heat sinks constructed by means of conventional techniques. Finally, since only one metal layer is formed on each side of a ceramic substrate, the use of the present invention results in a substantial reduction in manufacturing costs as compared with the prior art.

FIG. 6 illustrates an electronic device 60 utilizing copper layers formed in accordance with the present invention as high current conductors. The electronic device 60 comprises a heat sink 62 bonded in the manner previously described to a ceramic body 64. A pair of conductors 66 and 68 are formed on the surface of the ceramic body 64. A first pad 70 is formed at one end of the conductor 66 and a lead 72 is bonded at one end of pad 70. A second pad 73 is formed at the other end of conductor 66 and a semiconductor chip 74 is mounted thereon. A wire lead 76 is bonded at one end to the semiconductor chip 74 at at the other end to a pad 78 formed at one end of the conductor 68. A second pad 80 is formed at the other end of the conductor 68 and is bonded to a wire lead 82. The electronic device illustrated in FIG. 6 may be operated with relatively high current due to the low sheet resistivity of the conductors 66 and 68.

Conductors 66 and 68 are formed according to the invention in the manner previously described. A layer of bonding material such as molybdenum-manganese is silk screened onto the surface of the ceramic body 64 and the ceramic body and the molybdenum-manganese layer formed thereon is baked at about 1,300°C in a hydrogen ($H_2$) atmosphere. After formation of the bonding layer, a layer of material containing either particulate elemental copper or an oxide of copper is applied to the bonding layer. The copper containing layer may comprise any of the materials previously defined. The copper containing layers may be applied by dipping and spinning as previously described or by silk screening.

If elemental copper particulates are applied, the entire body is heated from room temperature up to about 2,100°F to fuse the copper layer. Alternatively, if a copper-bearing material such as cuprous oxide in a gelled film-forming vehicle as previously described is used, the cuprous oxide must be air dried at approximately 100°C to remove the volatile solvent. Thereafter the device is heated up to about 2,100°F in order to remove the binder of the cuprous oxide material, to reduce the cuprous oxide to elemental copper and to fuse the elemental copper so that it will tightly bond to the bonding layer of manganese or molybdenum-manganese.

The resulting copper conductors have a very low sheet resistivity and may thus be used in the manner shown in FIG. 6 to connect to semiconductor chips and the like in high current applications.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. An electrically isolated heat sink for providing thermal protection for an electronic component comprising:

a ceramic substrate formed from a material selected from the group including alumina and beryllium oxide and having opposed substantially planar surfaces, a molybdenum-manganese bonding layer formed on each of said opposed substantially planar surfaces of the ceramic substrate, a unitary, discrete copper layer formed on each of said bonding layers, said copper layers each comprising substantially elemental copper so as to provide maximum heat transfer, maximum ductility and maximum conductivity, heat sink means soldered to one of the copper layers, a component support member soldered to the other copper layer, and an electronic component mounted on the support member.

* * * * *